United States Patent [19]
Lee et al.

[11] Patent Number: 5,943,210
[45] Date of Patent: Aug. 24, 1999

[54] COOLING DEVICE FOR CENTRAL PROCESSING UNIT MODULE

[75] Inventors: Ken Lee, Chung-Ho; Richard Lee; Stanley Chen, both of Taipei, all of Taiwan

[73] Assignee: Hon Hai Precision Ind. Co., Ltd., Taipei Hsien, Taiwan

[21] Appl. No.: 09/084,463

[22] Filed: May 26, 1998

[30] Foreign Application Priority Data

May 24, 1997 [TW] Taiwan ................................. 86208601

[51] Int. Cl.$^6$ ....................................................... H05K 7/20
[52] U.S. Cl. ........................... 361/697; 361/694; 361/695; 361/704; 361/707; 361/717; 361/722; 165/80.3; 165/80.4; 165/185; 257/718; 257/723; 257/727; 174/16.3
[58] Field of Search ..................................... 361/680–697, 361/700–722, 818, 849, 683, 736; 165/80.3, 80.4, 80.2, 185, 125, 299; 415/177; 439/66, 71; 70/24; 257/702–723

[56] References Cited

U.S. PATENT DOCUMENTS 5,648,889 7/1997 Bosli ....................................... 361/704
5,771,153 6/1998 Sheng ..................................... 361/697

*Primary Examiner*—Gerald Tolin
*Assistant Examiner*—Michael Datskovsky

[57] ABSTRACT

A cooling device for a CPU module includes an attachment plate fixed to the module and in contact with a CPU in the module. The attachment plate defines an elongate hole. A spring plate has two arms. A heat sink has a number of heat dissipating fins projecting from a base plate, wherein a portion of the fins have engaging teeth formed at free ends thereof. A mounting rod has a cross-slotted head and a tail formed with a locking tongue. A fan mounting plate is formed with two engaging teeth. A fan is screwed to the fan mounting plate. To assemble the cooling device, the locking tongue is extended through the spring, the heat sink and the elongate hole of the attachment plate and then rotated 90 degrees to engage an inner face of the attachment plate where the two arms of the spring are pressed to push the rod away from the heat sink whereby the heat sink and the attachment plate are fixedly connected. The mounting plate is then pressed onto the heat sink to cause the engaging teeth of the mounting plate to fixedly engage with the engaging teeth of the corresponding heat dissipating fins of the heat sink.

6 Claims, 5 Drawing Sheets

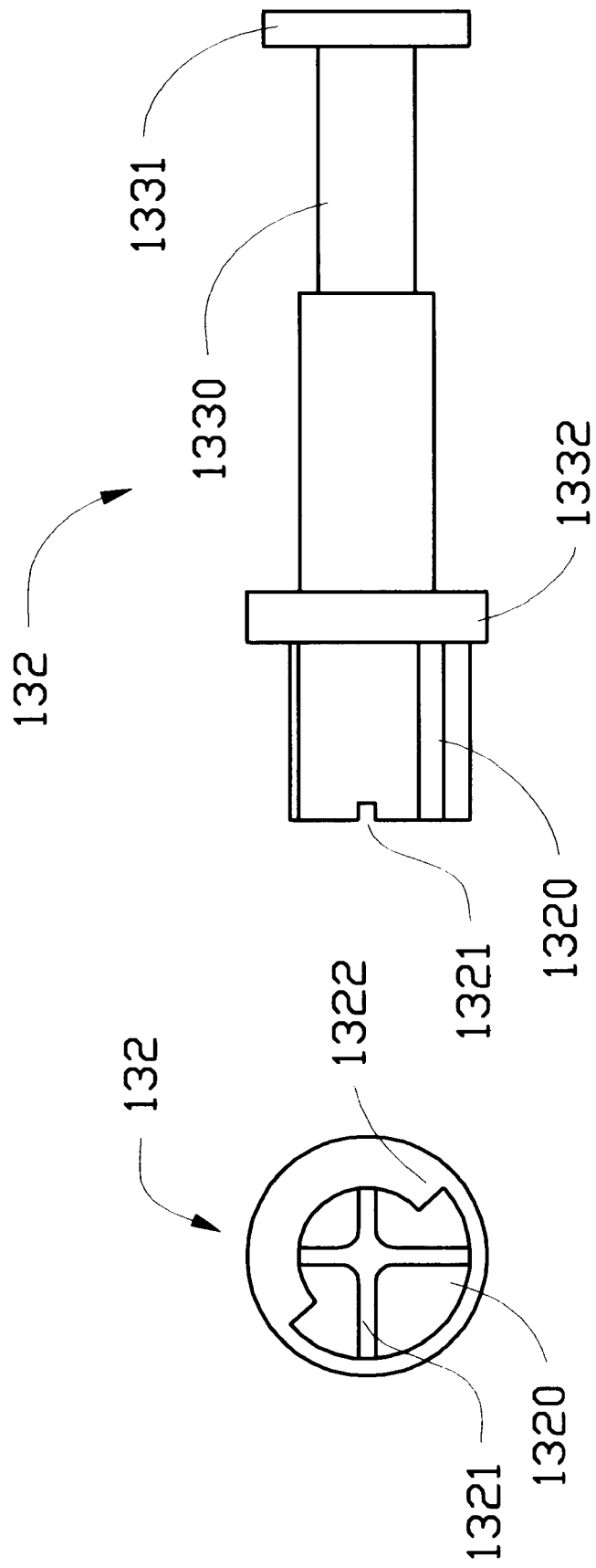

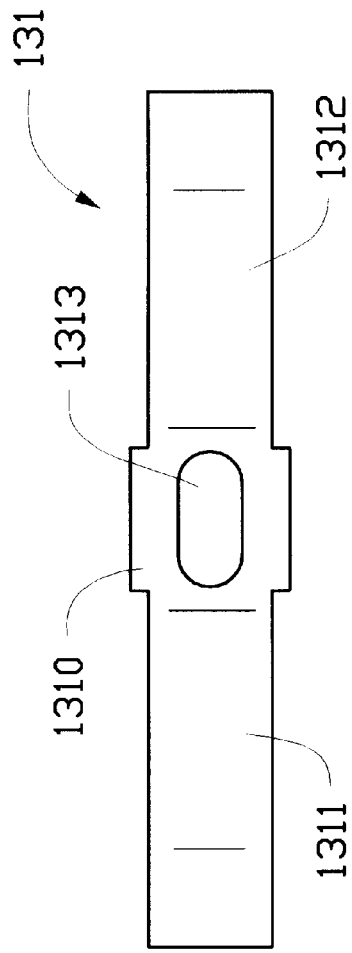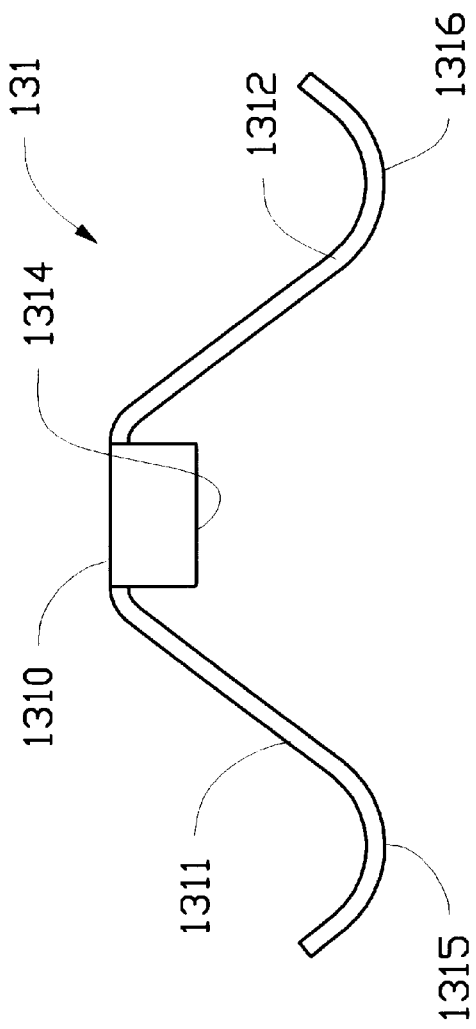
FIG.3(B)
FIG.3(A)

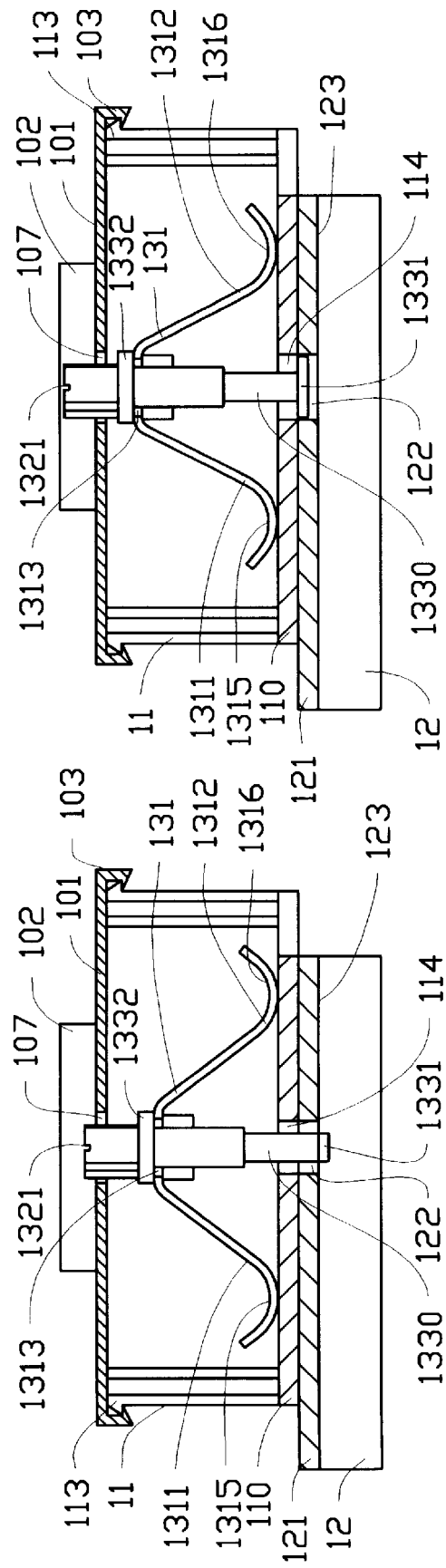

COOLING DEVICE FOR CENTRAL PROCESSING UNIT MODULE

BACKGROUND OF THE INVENTION

1. Field of the Invention

The present invention relates to a cooling device for a central processing unit (CPU) module, particularly to a cooling device which can be easily assembled to a CPU module and effectively dissipate heat generated by a CPU received in the module.

2. The Prior Art

As the power consumed by a CPU increases, the cooling thereof becomes an important issue. To cool the CPU a cooling device consisting of a heat sink formed by aluminum extrusion and an electrical fan is commonly assembled to a CPU module to forcibly dissipate heat generated by the CPU.

However, assembling a conventional cooling device to the CPU module is troublesome and laborious.

Hence, an improved cooling device for a CPU module is needed to eliminate the above mentioned defects of current cooling devices.

SUMMARY OF THE INVENTION

Accordingly, an objective of the present invention is to provide a cooling device for a CPU module which can be easily assembled to the module.

Another objective of the present invention is to provide a cooling device for a CPU module which can effectively dissipate heat generated by a CPU in the module.

To fulfill the above mentioned objectives, according to one embodiment of the present invention, a cooling device for a CPU module comprises an attachment plate fixed to the module, contacting with a CPU in the module and defining an elongate hole, a heat sink having a number of heat dissipating fins projecting from a base plate thereof wherein a portion of the fins define engaging teeth at free ends thereof, a spring plate having two arms, a mounting rod having a cross-slotted head and a tail end defining a locking tongue formed as an elongate plate, a fan mounting plate having engaging teeth and defining a central hole, and a fan fixedly mounted to the fan mounting plate and in alignment with the central hole.

To assemble the cooling device, the locking tongue of the mounting rod is extended through the spring plate, the base plate of the heat sink and the elongate hole of the attachment plate. The mounting rod is then rotated 90 degrees to fixedly engage with the attachment plate by a spring force of the spring plate having the two arms thereof engaged with the base plate of the heat sink and a rectangular body portion exerting a resilient force against a flange of the mounting rod. The fan mounting plate together with the fan is then pressed onto the heat sink to cause the engaging teeth of the mounting plate to fixedly engage with the fins having the engaging teeth formed at their free ends.

BRIEF DESCRIPTION OF THE DRAWINGS

FIG. 2(A) is a right side elevational view of a mounting rod of the cooling device;

FIG. 2(B) is a front end elevational view of the mounting rod;

FIG. 3(A) is a front elevational view of a spring plate of the cooling device;

FIG. 3(B) is a top view of FIG. 3(A);

FIG. 4(A) is a schematic view of the assembled cooling device and CPU module at an unlocked position;

FIG. 4(B) is a schematic view of the assembled cooling device and CPU module at a locked position.

DETAILED DESCRIPTION OF THE PREFERRED EMBODIMENT

Reference will now be made in detail to the preferred embodiments of the present invention.

Figure 1:
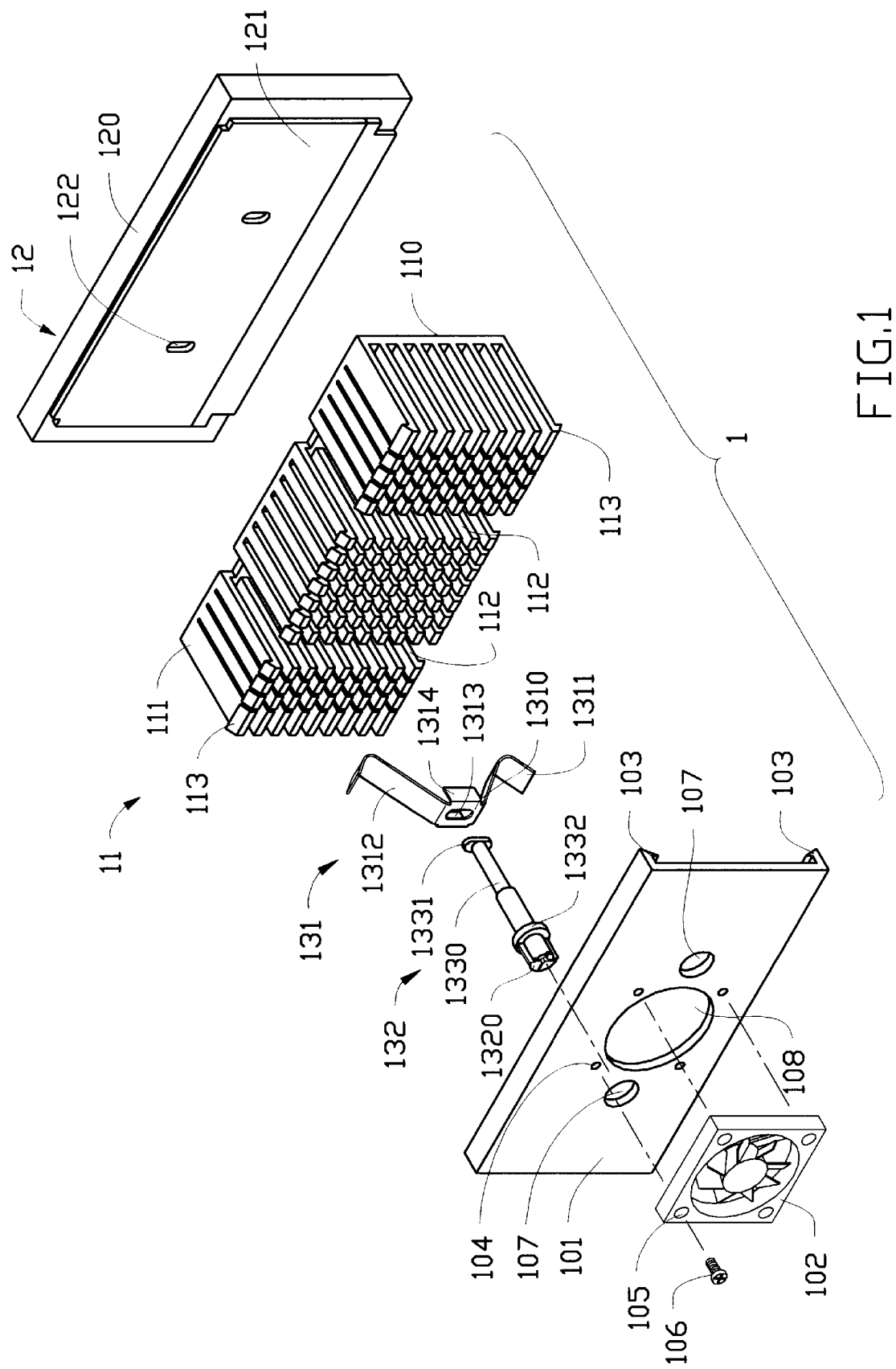
FIG. 1 is a perspective, exploded view of a cooling device in accordance with a first embodiment of the present invention and a CPU module.

Referring to FIG. 1, a cooling device 1 includes a conventional electrical fan 102, a fan mounting plate 101, a pair of heat sink mounting rods 132 (only one shown), a pair of spring plates 131 (only one shown), a heat sink 11 and a CPU attachment plate 121. The fan mounting plate 101, the heat sink 11 and the CPU attachment plate 121 are made of aluminum. The heat sink mounting rods 132 and the spring plates 131 are made of steel.

The fan 102 is mounted to the fan mounting plate 101 by extending a screw 106 through each hole 105 defined in the corners of the fan 102 to threadedly engage with a corresponding threaded hole 104 defined adjacent to a central hole 108 of the fan mounting plate 101, so that the fan 102 is aligned with the central hole 108 whereby when the fan 102 is activated, an air flow is generated to dissipate heat absorbed by the heat sink 11. Two round holes 107 are formed in the mounting plate 101 beside the four threaded holes 104, and the mounting plate 101 is further formed with two engaging teeth 103 extending rearward along top and bottom edges thereof.

Also referring to FIGS. 2(A) and 2(B), the mounting rod 132 is formed with a head 1320 defining a cross slot 1321 for fittingly receiving a screw driver (not shown) so that the mounting rod 132 may be manipulated by the screw driver to rotate about an axis of the rod 132. Furthermore, a portion 1322 of a perimeter of the head 1320 is cut away whereby when the cooling device 1 is assembled, the head 1320 will not interfere with the electric fan 102. A flange 1332 and a shaft portion 1330 successively connect the head 1320 to a locking tongue 1331 at a tail end of the rod 132. The locking tongue 1331 is formed as an elongate plate.

Also referring to FIGS. 3(A) and 3(B), the spring plate 131 is formed to have a rectangular body portion 1310 defining an elongate hole 1313 having a shape slightly larger than the locking tongue 1331. Two spring arms 1311, 1312 extend downward from two shorter sides of the body portion 1310, and two reinforcing tabs 1314 extend downward from two longer sides of the body portion 1310. The spring arms 1311, 1312 respectively define arc portions 1315, 1316.

Returning to FIG. 1, the heat sink 11 is formed to have a number of heat dissipating fins 111 projecting from a rectangular base plate 110 to have a generally rectangular profile. The fins 111 are divided into three groups which are separated from each other by two grooves 112. The fins 111 comprising upper and lower rows of the heat sink 11 form engaging teeth 113 at free ends thereof for engaging with the engaging teeth 103 of the fan mounting plate 101 when the mounting plate 101 is pressed onto the heat sink 11. The base plate 110 defines two elongate holes 114 (FIGS. 4(A) & 4(B)) in communication with the grooves 112, respectively.

The CPU attachment plate 121 is fixed to a housing 120 of a CPU module 12 receiving a CPU (not shown) therein. The CPU has a surface engaging with the CPU attachment plate 121, whereby heat generated by the CPU can be absorbed by the attachment plate 121.

To assemble the cooling device 1 to the CPU module 12, also referring to FIGS. 4(A) and 4(B), the spring plates 131 are firstly positioned into the grooves 112 and the arc portions 1315, 1316 of the arms 1311, 1312 contact the base plate 110 of the heat sink 11. The mounting rods 132 are then extended through the elongate holes 1313 of the spring plates 131, the elongate holes 114 of the base plate 110 of the heat sink 11 and elongate holes 122 defined in the attachment plate 121. The mounting rods 132 are then rotated ninety degrees thereby causing the locking tongues 1331 to engage with a face 123 of the attachment plate 121 inside the housing 120. Due to a resilient force of the spring plates 131 pushing the flanges 1332 away from the heat sink 11, the heat sink 11 and the attachment plate 121 are fixedly connected together so that heat absorbed by the attachment plate 121 from the CPU can be effectively transmitted to the heat sink 11.

Thereafter, the fan mounting plate 101, which has been fastened with the fan 102, is pressed onto the heat sink 11 to reach a position in which the engaging teeth 103 of the mounting plate 101 fixedly engage with the engaging teeth 113 of the upper and lower rows of fins 111. Since the fins 111 have a certain degree of elasticity, when the mounting plate 101 is pressed onto the heat sink 11, the fins 111 formed with the engaging teeth 113 deform to receive the engaging teeth 103 of the fan mounting plate 101 so that the fan mounting plate 101 can easily reach the fixedly engaged position. When the fan mounting plate 101 is fixed to the heat sink 11, the heads 1320 of the mounting rods 132 extend through the round holes 107, respectively. Since the fan 102 is mounted to the hole 108 communicating with the heat dissipating fins 111, when the electrical fan 102 is activated, an air flow is generated through the fins 111 to effectively dissipate heat emitted by the fins 111.

Figure 5:
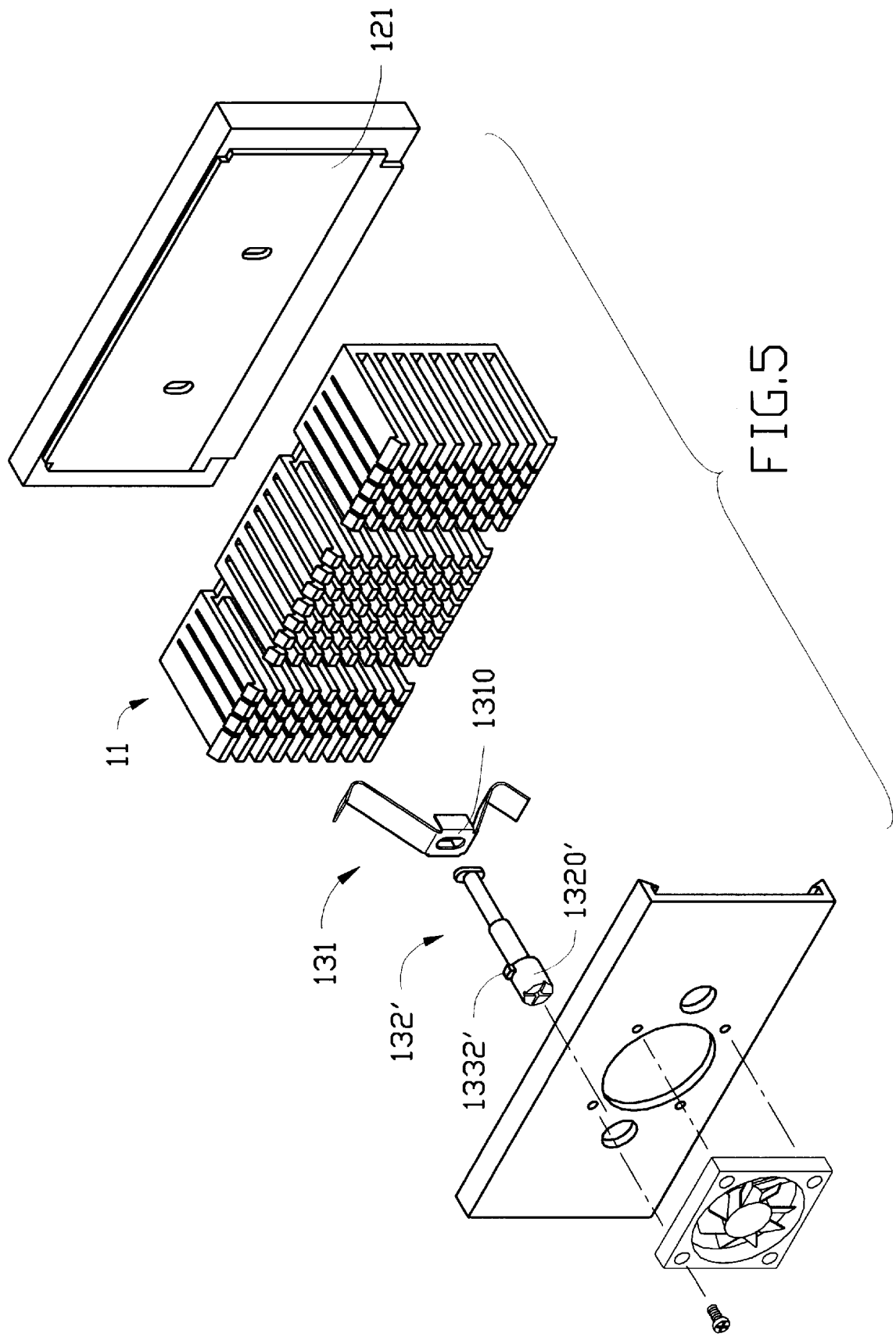
FIG. 5 is a perspective, exploded view of a cooling device in accordance with a second embodiment of the present invention and the CPU module.

FIG. 5 shows an alternate embodiment of the present invention, wherein a mounting rod 132' is formed to have a small head 1320' so that the cut away portion 1322 of the first embodiment is not necessary. Furthermore, in the second embodiment, a key 1332' is formed on a perimeter of the head 1320' and replaces the flange 1332 of the first embodiment. The key 1332' engages with the body portion 1310 to receive the resilient force of the spring plate 131 when the rod 132' is extended through the spring plate 131, the heat sink 11 and the attachment plate 121. The rod 132' is then rotated 90 degrees thereby causing the heat sink 11 to fixedly connect with the attachment plate 121.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A cooling device for a CPU module having a housing receiving a CPU therein, said cooling device comprising:
   a rectangular metallic attachment plate fixed to the housing and in contact with the CPU;
   a metallic heat sink having a rectangular base plate attached to the attachment plate and defining a longitudinal direction and a lateral direction perpendicular to the longitudinal direction, a number of heat dissipating fins projecting from the rectangular base plate and a groove defined in the fins in the lateral direction of the base plate;
   a spring attached to the heat sink and received in the groove;
   a mounting rod having a first section extending through the spring, the heat sink and the attachment plate, and a second section pushed by the spring away from the heat sink thereby causing the first section to fixedly engage with the attachment plate; and
   a fan mounting plate pressed onto the heat sink to fixedly connect therewith and an electrical fan fixed to the fan mounting plate, said fan being in alignment with a first hole defined in the mounting plate wherein the mounting rod further comprises a manipulating head extending through a second hole defined in the fan mounting plate and located beside the first hole, the second section being located between the manipulating head and the first section;
   wherein the spring comprises a body portion through which the first section of the mounting rod extends and two arms extending from opposite sides of the body portion, and abutting against the heat sink to generate a resilient force on the second section of the mounting rod.

2. The cooling device in accordance with claim 1, wherein the first section is an elongate plate extending through an elongate hole defined in the attachment plate.

3. The cooling device in accordance with claim 2, wherein the second section is a flange.

4. The cooling device in accordance with claim 2, wherein the second section is a key.

5. The cooling device in accordance with claim 1, wherein the fins form first engaging teeth at free ends thereof, and wherein the fan mounting plate forms second engaging teeth which engage with the first engaging teeth when the fan mounting plate is pressed onto the heat sink to be fixed thereto.

6. The cooling device in accordance with claim 1, wherein the manipulating head of the mounting rod is a cross-slotted head.

* * * * *